(12) United States Patent
Dray et al.

(10) Patent No.: US 8,605,479 B2
(45) Date of Patent: Dec. 10, 2013

(54) NONVOLATILE MEMORY ARCHITECTURE

(75) Inventors: Cyrille Dray, Antibes (FR); Alexandre Ney, Le Puy Ste Reparade (FR); Karl Hofmann, Munich (DE)

(73) Assignee: Infineon Technologies AG, Neubiberg (DE)

( * ) Notice: Subject to any disclaimer, the term of this patent is extended or adjusted under 35 U.S.C. 154(b) by 416 days.

(21) Appl. No.: 12/911,603

(22) Filed: Oct. 25, 2010

(65) Prior Publication Data

US 2012/0099359 A1    Apr. 26, 2012

(51) Int. Cl.
*G11C 5/06*    (2006.01)

(52) U.S. Cl.
USPC ............... 365/72; 365/50; 365/104; 365/148; 365/157

(58) Field of Classification Search
USPC .............................. 365/72, 50, 104, 148, 157
See application file for complete search history.

(56) References Cited

U.S. PATENT DOCUMENTS

| | | |
|---|---|---|
| 7,248,498 B2 | 7/2007 | Nazarian |
| 7,679,952 B2 | 3/2010 | Lambert et al. |
| 8,243,490 B2 * | 8/2012 | Dray ................................. 365/63 |
| 2009/0161413 A1 | 6/2009 | Yoon et al. |
| 2010/0118590 A1 | 5/2010 | Carter et al. |
| 2010/0254181 A1 | 10/2010 | Chung et al. |

* cited by examiner

*Primary Examiner* — Toan Le
(74) *Attorney, Agent, or Firm* — SpryIP, LLC

(57) ABSTRACT

Representative implementations of memory devices have transistors between memory cells of a memory device. Memory devices may be arranged in memory arrays. The use of transistors may include alternately providing electrical isolation or current paths between pairs or groups of memory cells in a memory array.

23 Claims, 13 Drawing Sheets

NONVOLATILE MEMORY ARCHITECTURE

BACKGROUND

There is a desire in electronic devices to include more memory capacity (i.e., memory storage units, memory cells, etc.) in smaller packages. Generally, design rules dictate the number of memory cells that may be included within a given physical area of a memory device. Design rules may include materials, dimensions, and spacing requirements that dictate how densely populated a memory device may be. Memory cell access devices (including contacts) may be one restricting factor to the size of a memory device or its density. For example, a desired level of current used to write to nonvolatile memory (NVM) elements may require a minimum size conducting path to the NVM elements in order to provide sufficient current to control the memory cells. Additionally, minimum spacing between elements is often necessary to electrically isolate the elements located within the memory device from each other. These issues become increasingly more important as the technology used for memory devices (e.g., 65 nm, 45 nm, 40 nm, 32 nm, 28 nm, etc.) becomes increasingly smaller.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

DETAILED DESCRIPTION

Overview

Representative implementations of memory devices, including memory arrays are disclosed. Implementations include high-density nonvolatile memory devices. Memory devices include multiple memory cells that are comprised of memory storage components (e.g., nonvolatile memory dipole devices) and switching devices (switches). In alternate implementations, additional components may be included in the memory devices, or other components may be used in place of one or more of the memory storage components or the switches.

In some implementations, the switches may be transistors, for example, metal-oxide-semiconductor (MOS) devices. In alternate implementations, other devices may be used for switches (e.g., diode, memristor, etc.) or other types of transistors may be used (e.g., bipolar junction transistor (BJT), junction field-effect transistor (JFET), fast-reverse epitaxial diode field-effect transistor (FREDFET), etc.). In various implementations, one or more additional transistors are included in the memory devices, the transistors being coupled to the memory cells such that they provide electrical isolation of the memory cells from each other. This may result in an increase in the density of memory cells included in a memory device, as well as an increase in the write current capability of the memory cells (and thus the memory device) for the size/density of the memory device, as is described below.

In alternate implementations, the one or more additional transistors (isolation transistors) are controlled such that they provide isolation when unselected and they provide current paths when selected. This may result in further increase in current capability of the memory device in relation to the device size, thus improving the Figure of Merit current drive per unit area. Isolation transistors may also be coupled to pairs or groups of memory cells, to provide isolation (or current paths) between the pairs or groups of memory cells. Multiple write paths may result, providing an increased current capability of a memory device, as described below.

Further techniques may be applied in conjunction with the use of isolation transistors to add features to memory devices, or reduce their size. In one implementation, two or more memory cells in a memory device may share source lines. Further, two or more pairs or groups of memory cells may have a shared source line. In alternate implementations, isolation transistors may be arranged with respect to the memory cells so as to take advantage of shared source lines. Sharing of source lines may result in an increased density of memory cells for a memory device, as described in a later section.

Figure 1:
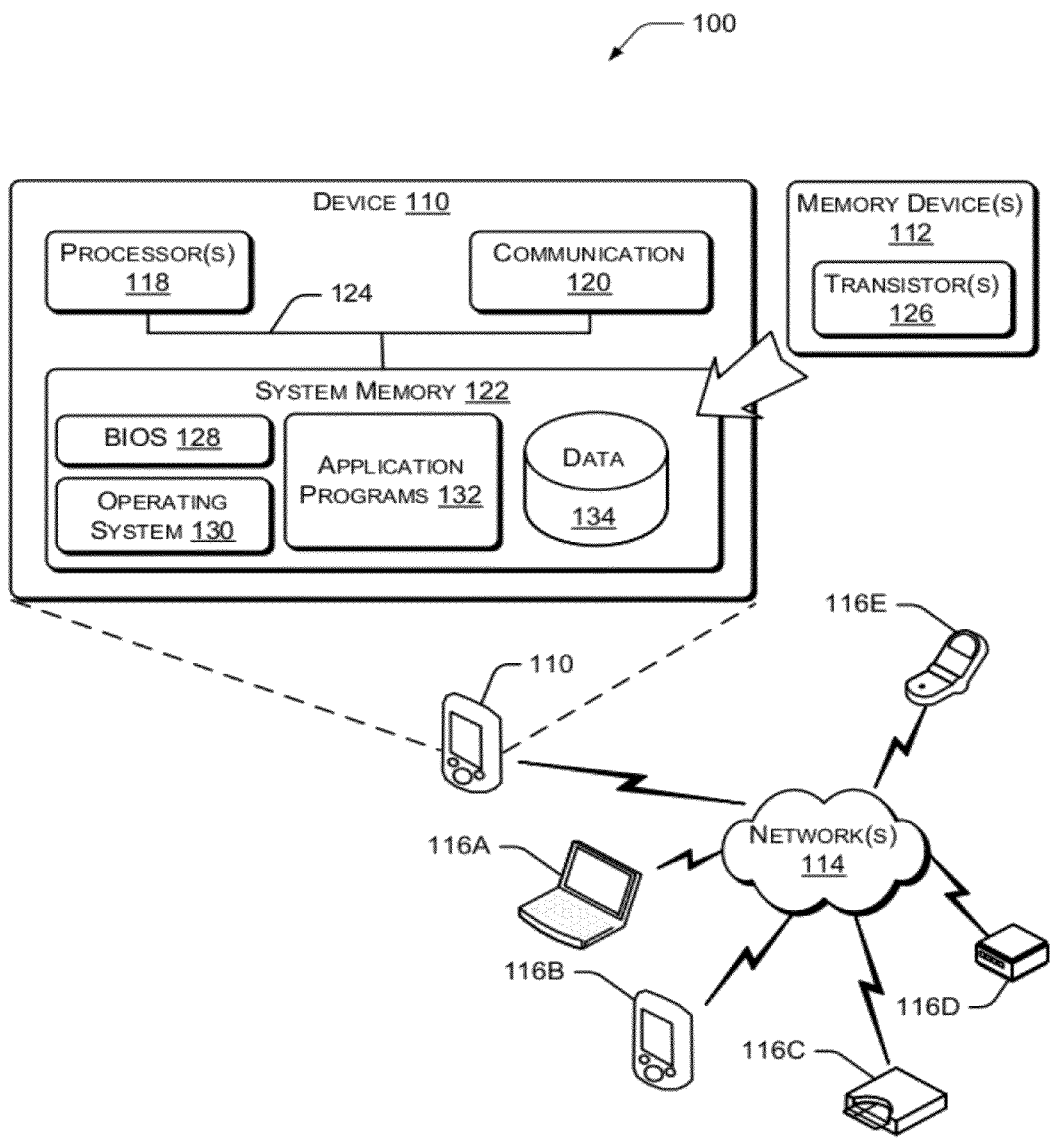
FIG. 1 is a representative environment in which the techniques in accordance with the present disclosure may be implemented.
Figure 2:
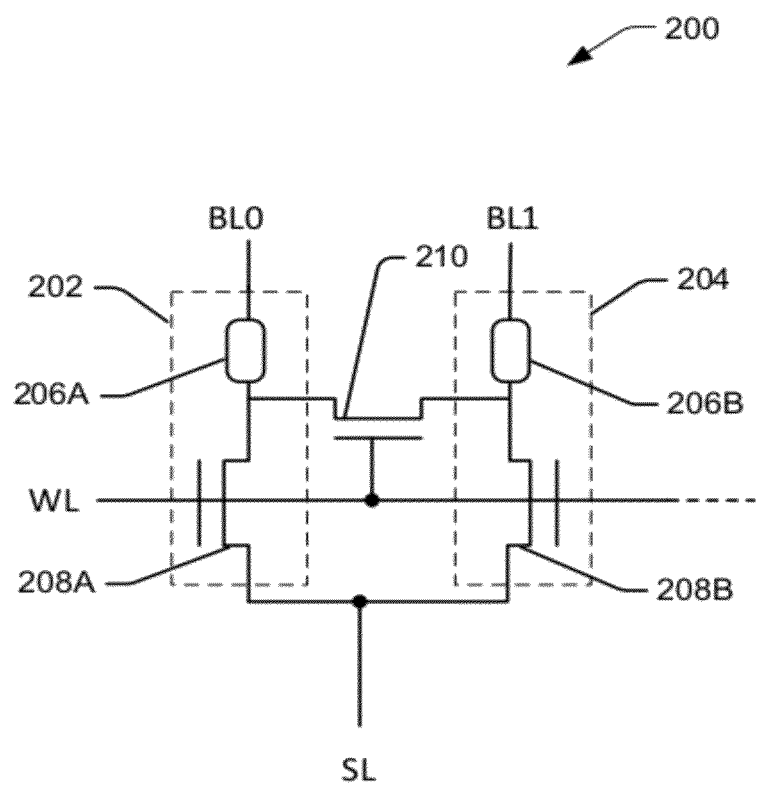
FIG. 2 is a schematic drawing of a first implementation of memory device architecture.
Figure 3:
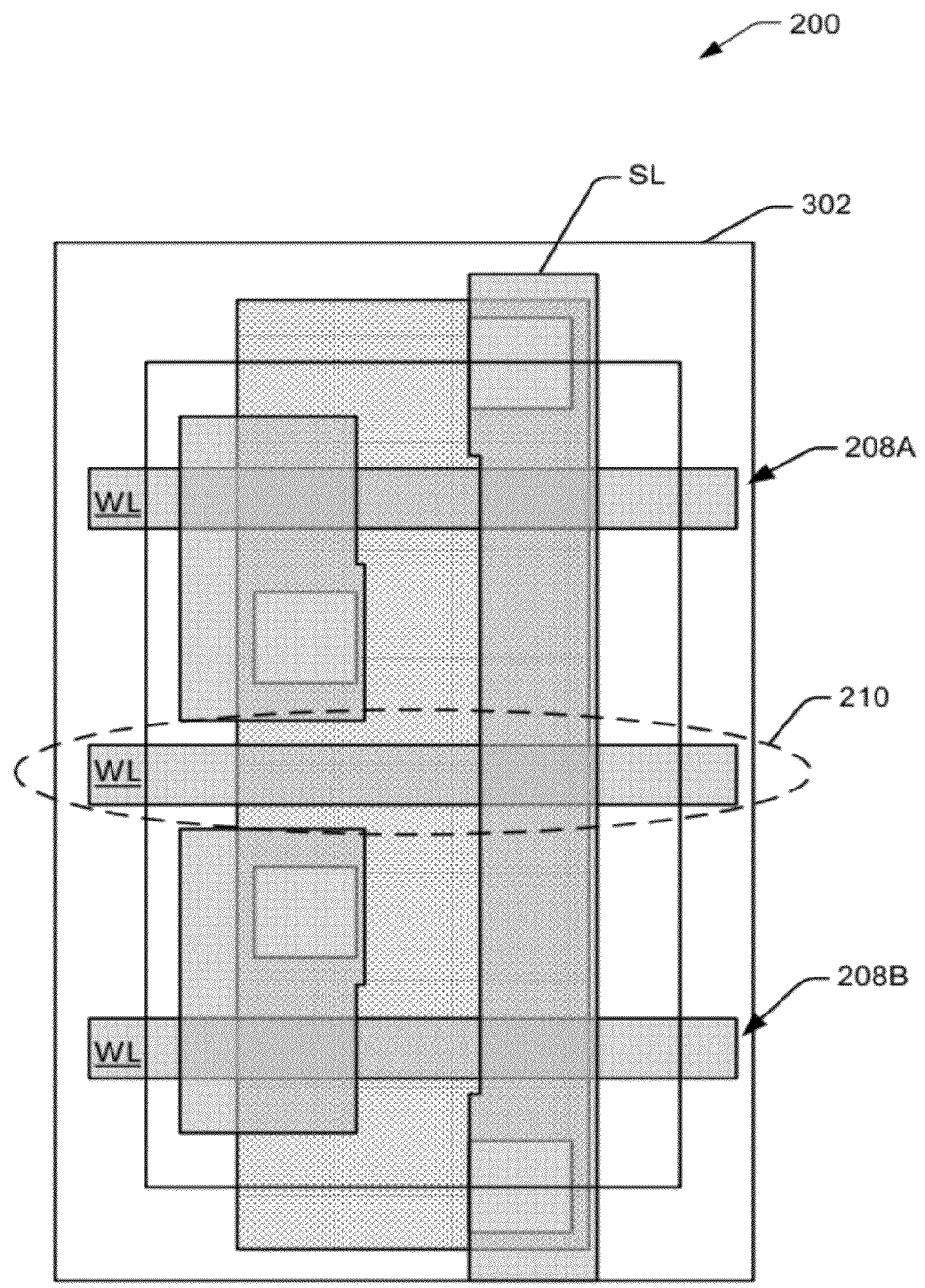
FIG. 3 is a schematic drawing of an example layout of the memory architecture of FIG. 2.

A representative environment for implementing the techniques disclosed herein is shown in FIG. 1. The representative environment illustrates one possible example of the techniques (and one or more memory devices) as applied to an electronic device. An illustrative overview is described with reference to a first implementation of a memory device in FIGS. 2 and 3, showing the use of isolation transistors in memory device architecture.

Figure 4:
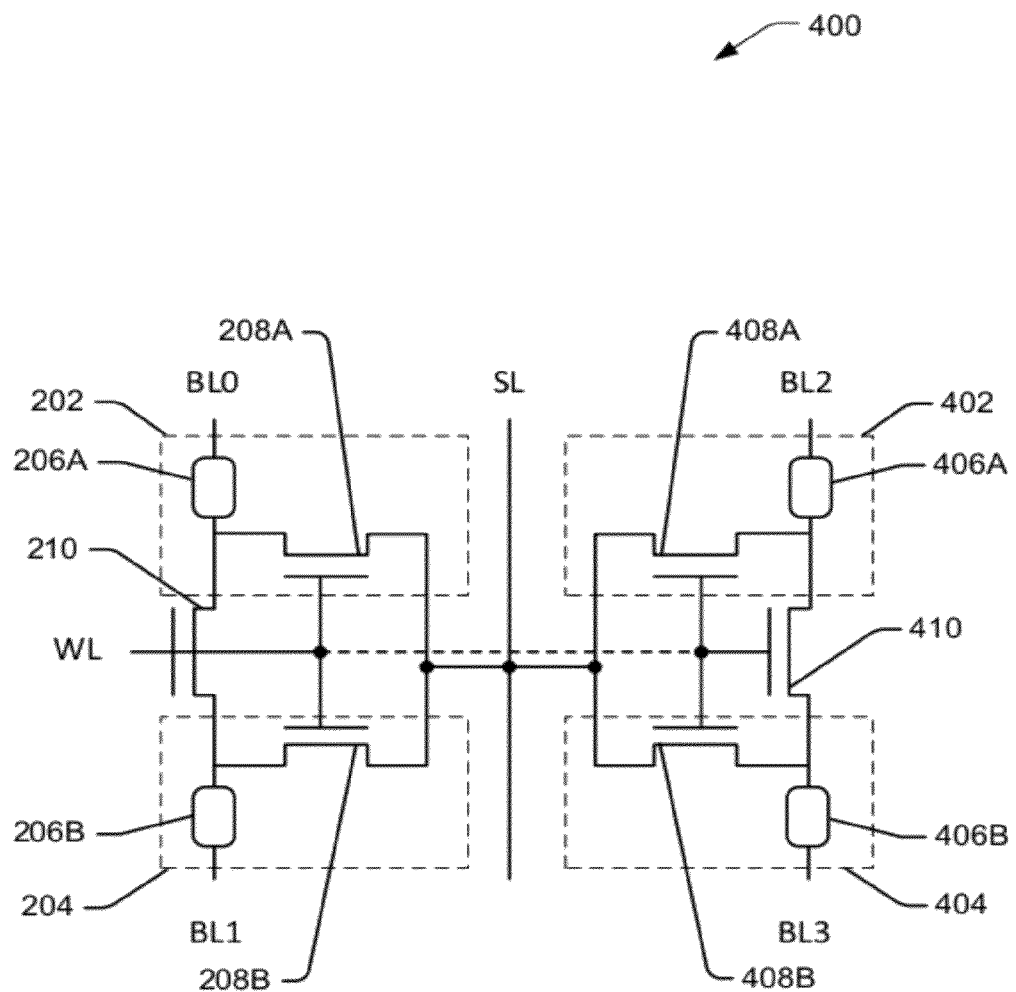
FIG. 4 is a schematic drawing of a second implementation of memory device architecture.
Figure 5:
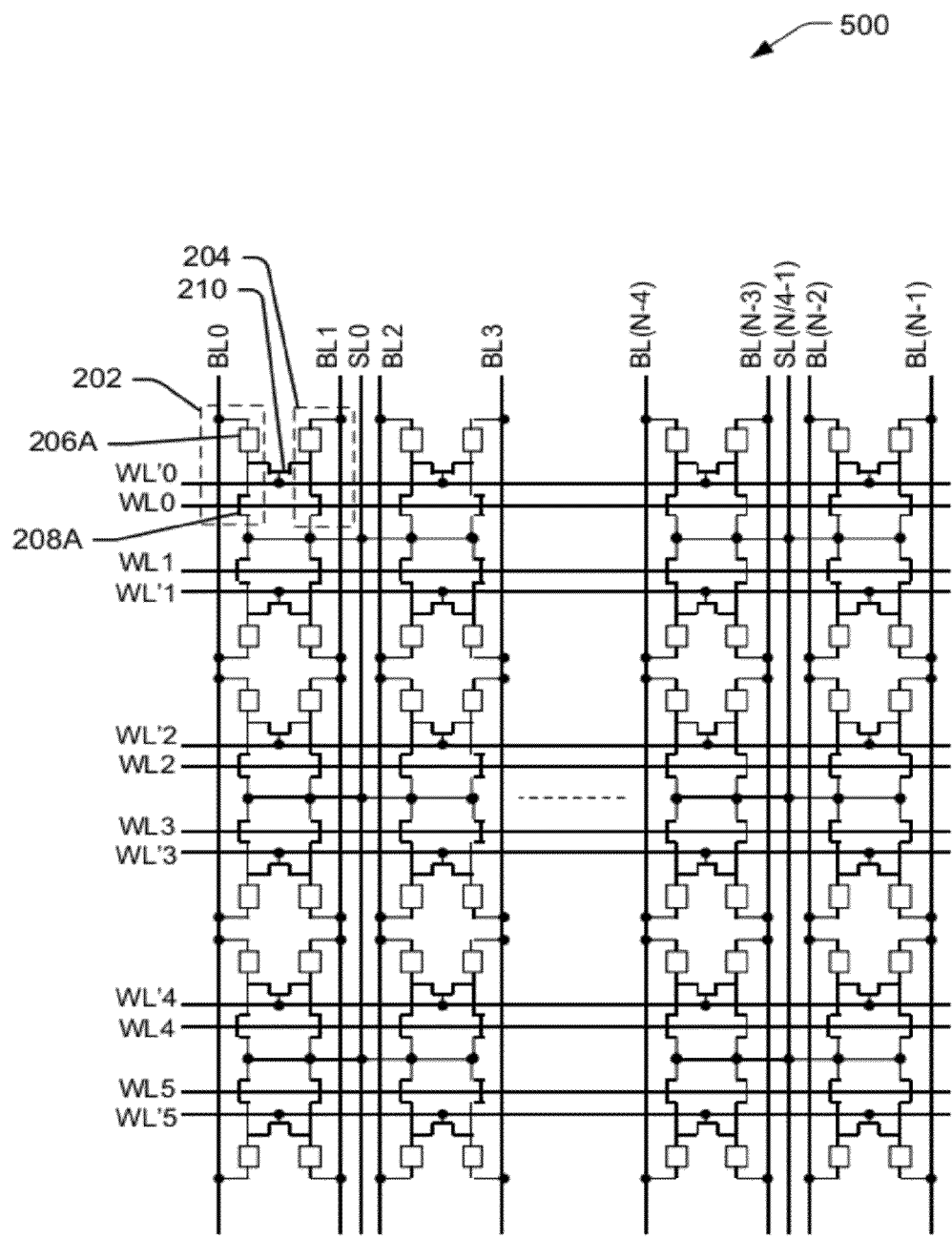
FIG. 5 is a schematic drawing of an example array of memory devices according to the memory device architecture of FIGS. 2 and 4.
Figure 6:
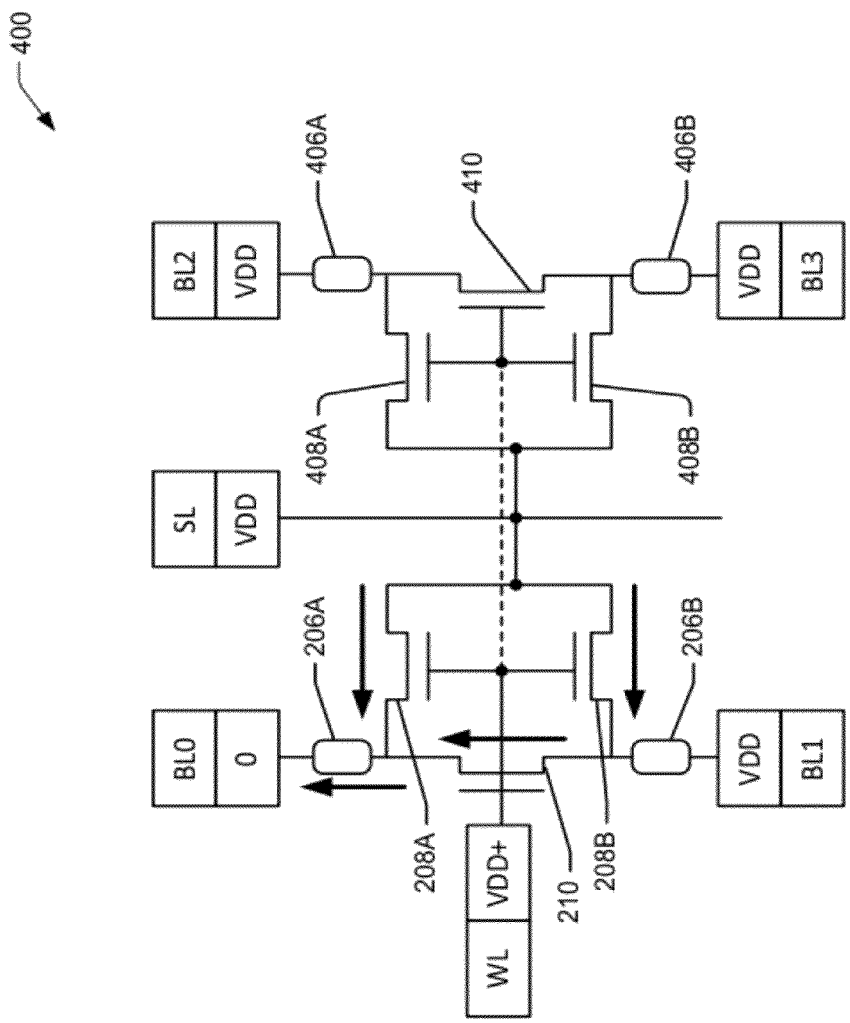
FIG. 6 is a current flow diagram illustrating example operation principles of the implementations of FIGS. 2 and 4.
Figure 7:
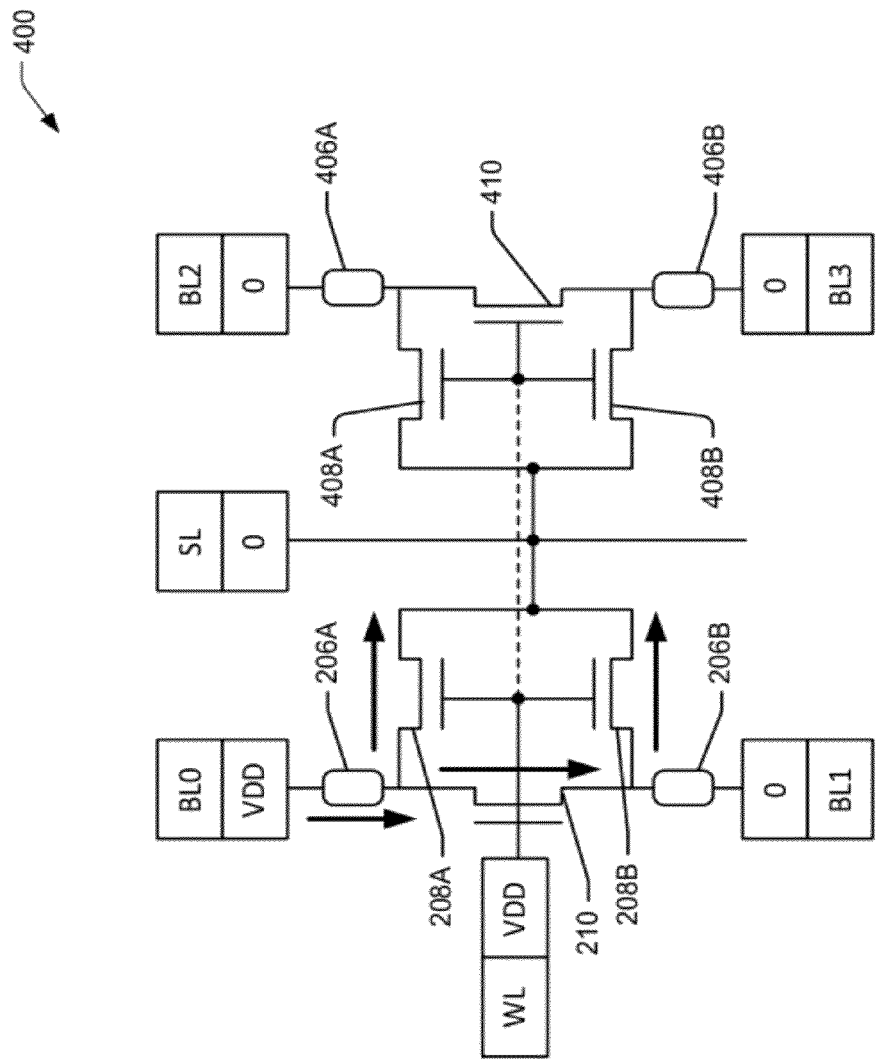
FIG. 7 is a current flow diagram illustrating other example operation principles of the implementations of FIGS. 2 and 4.

A second example implementation of memory device architecture is shown in FIG. 4, and an array of devices is shown in FIG. 5. The illustration of FIG. 5 shows the techniques applied in an example memory array, and is generally applicable to any of the memory device techniques, architectures, and implementations disclosed herein. FIGS. 6-9 illustrate example operational principles of the memory device implementations discussed. The illustrations of FIGS. 6-7 show bi-directional write current capabilities in accordance with the techniques herein. FIGS. 6-9 also show the use of shared and/or separate word lines for control of memory device components. Chip area benefits and electrical isolation benefits are discussed with reference to these figures.

A third example implementation of memory device architecture is discussed with reference to FIGS. 10-12. The third implementation introduces the use of additional isolation transistors between pairs or groups of memory cells, increasing the current capability of the memory device as well as providing isolation between the pairs or groups of memory cells. Illustrative current paths are also discussed with respect to these figures, showing example operational characteristics. FIG. 13 describes an example method for electrically isolating at least two memory cells from each other.

The devices and techniques disclosed herein are described generally with reference to 45 nm technology. However, this is not intended to be limiting. The device architectures and techniques are generally independent of the technology used, and are applicable to other technologies (e.g., 65 nm, 40 nm, 32 nm, 28 nm, etc.) as well.

Implementations are explained in more detail below using a plurality of examples. Although various implementations and examples are discussed here and below, further implementations and examples may be possible by combining the features and elements of individual implementations and examples.

Representative Environment

FIG. 1 illustrates a representative environment 100 in which techniques in accordance with the present disclosure may be implemented. In this implementation, the environment 100 includes a device 110, or other mobile and/or electronic devices, having implemented memory devices 112 configured in accordance with the teachings of the present disclosure. (For example, a memory device 112 may include one or more of memory devices 200, 400, 1000, or the like, as discussed below.) The device 110 may operatively communicate via one or more networks 114, such as a wireless local area network (WLAN), with a plurality of other devices 116. Alternatively, the device 110 may bypass the networks 114 and communicate directly with one or more of the other devices 116. Detailed descriptions of various implementations of memory devices 112, methods, and techniques are provided in the following sections with reference to FIGS. 2 through 13.

In the representative environment 100, the device 110 may be a hand-held device, such as an MP3 (Moving Picture Exerts Group Layer-3) player, a personal data assistant (PDA), a global positioning system (GPS) unit, mobile telephone, smart phone, or other similar hand-held device, and the other devices 116 may include, for example, a computer 116A, another hand-held device 116B, a compact disc (CD) or digital versatile disc (DVD) player 116C, a signal processor 116D (e.g., radio, navigational unit, television, etc.), and a mobile phone 116E. In alternative implementations, the devices 110, 116 may include any other suitable devices (e.g., automotive computing and/or entertainment device, appliance computing/control device, e-reader, tablet computer, etc.), and it is understood that any of the plurality of devices 116 may be equipped with memory devices 112 that operate in accordance with the teachings of the present disclosure.

As further shown in FIG. 1, the device 110 may include one or more processors 118 and one or more communication components 120 (e.g., transceivers, transmitters, receivers, modems, etc.), coupled to a system memory 122 by a system bus 124. In the implementation shown in FIG. 1, one or more memory devices 112 (or arrays of memory devices 112) are included as an element of the system memory 122 of the device 110. Further, one or more isolation transistors 126 are included as an element of a memory device 112, as described in detail below. In alternative implementations, the memory devices 112 may be integrated with any other suitable portion of the device 110, or may be a separate, individual component of the device 110. For example, memory devices 112 may be a component of a remote or peripheral device coupled to the device 110 (e.g., portable memory device, input device, output device, display device, etc.).

The system bus 124 of the device 110 represents any of the several types of bus structures, including a memory bus or memory controller, a peripheral bus, an accelerated graphics port, and a processor or local bus using any of a variety of bus architectures. The communication component 120 may be configured to operatively communicate with one or more external networks 114, such as a cellular telephone network, a satellite network, an information network (e.g., Internet, intranet, cellular network, cable network, fiber optic network, LAN, WAN, Bluetooth™, etc.), an infrared or radio wave communication network, or any other suitable network.

The system memory 122 may also include computer-readable media (which may include memory devices 112 and/or other memory components (e.g., magnetic or optical disk drives, etc.)) configured to store data and/or program modules that are immediately accessible to and/or presently operated on by the processor 118. For example, the system memory 122 may also store a basic input/output system (BIOS) 128, an operating system 130, one or more application programs 132, and program data 134 that can be accessed by the processor 118 for performing various tasks desired by a user of the device 110.

Generally, program modules executed on the device 110 (FIG. 1) may include routines, programs, objects, components, data structures, email applications, and/or web browsers, etc., for performing particular tasks or implementing particular abstract data types. These program modules and the like may be executed as a native code or may be downloaded and executed such as in a virtual machine or other just-in-time compilation execution environments. Typically, the functionality of the program modules may be combined or distributed as desired in various implementations.

Although the representative environment 100 is shown as in FIG. 1 as a communication network, this implementation is meant to serve only as a non-limiting example of a suitable environment for use of the devices, methods, and techniques described herein. Similarly, the device 110 is simply one non-limiting example of a suitable device that may include memory devices 112 in accordance with the present disclosure.

Example Memory Architecture

FIG. 2 is a schematic drawing showing an illustrative overview of memory device techniques and architectures, using an example memory device 200. It is to be understood that a memory device 200 may be implemented as, or part of another system as described with reference to FIG. 1 (for example, memory devices 112, system memory 122, processor(s) 118, communication component 120, and the like, may include one or more example memory devices 200). Further, an example memory device 200 may be implemented as removable and/or non-removable memory media implemented in any method or technology for storage of information such as computer-readable instructions, data structures, program modules, or other data. Such memory media includes, but is not limited to, random access memory (RAM), read only memory (ROM), electrically erasable programmable ROM (EEPROM), flash memory, or other memory technology, which can be used to store desired information and which can be accessed by a processor such as processor 118 and/or a device such as device 110.

In an example implementation, a memory device 200 comprises a first memory cell 202 and a second memory cell 204. In alternate implementations, a memory device 200 may comprise any number of memory cells, and remain within the scope of the disclosure. The first memory cell 202 and second memory cell 204 are generally made up of a memory storage device 206 (shown as memory storage devices 206A and 206B) and a switch 208 (shown as switches 208A and 208B). In one implementation, memory storage devices 206A and 206B are nonvolatile memory (NVM) dipole devices. For example, memory storage devices 206A and 206B may be magnetic tunnel junction (MTJ) dipole devices, or the like. In alternate implementations, memory storage devices 206A and 206B may be any type of memory storage device that is capable of storing at least two memory states (e.g., 0, 1), and may be accessed (e.g., written to and/or read) through bit lines, such as BL0 and BL1. For example, memory storage devices 206A and 206B may comprise ROM storage devices (i.e., contact ROM, via ROM, etc.), phase-change memory devices (i.e., PCM, PRAM, PCRAM, OUM, Chalcogenide RAM, C-RAM, etc.), and/or polarized devices such as MRAM, FERAM, RERAM, CBRAM, FE Polymer devices, NROM, or the like.

In one implementation, switches 208A and 208B are transistors, for example MOS transistor devices. For example, in alternate implementations, switch 208A and switch 208B may be NMOS or PMOS devices. In alternate implementations, other devices may be used for switches 208A and 208B (e.g., diodes, memristors, etc.) or other types of transistors may be used (e.g., junction field-effect transistor (JFET), fast-reverse epitaxial diode field-effect transistor (FREDFET), etc.).

In an implementation, as shown in FIG. 2, a word line WL is coupled to both of the switches 208A and 208B. The word line WL toggles the switches 208A and 208B from a first state to a second state. For example, in one implementation, the word line WL toggles at least one of the switches 208A and/or 208B from an "on" state, where the respective switch passes current through the switch to an "off" state, where the respective switch electrically isolates the terminals of the switch, preventing current through the switch, or vice versa. The word line WL may control the flow of current through the respective memory storage devices (206A and 206B) for reading and/or writing to the respective memory storage devices (206A and 206B). In alternate implementations, the word line WL may be coupled to the switches 208A and 208B such that the switches operate in unison when controlled by the word line WL (i.e., both on or both off together) or the switches 208A and 208B may operate opposite to each other (i.e., one turns off when the other turns on, and vice versa). In other alternate implementations, more than one word line may be used in the memory device 200, as described below.

In one implementation, as shown in FIG. 2, memory cells 202 and 204 are both coupled to a shared source line SL. In alternate implementations, memory cells 202 and 204 may be coupled to separate source lines. In the example memory device 200, memory cell 202 is accessed via bit line BL0 and memory cell 204 is accessed via bit line BL1. Access to memory cells 202 and 204 includes read and/or write access.

In one implementation, as shown in FIG. 2, a transistor 210 is coupled between memory cell 202 and memory cell 204. Transistor 210 may be referred to herein as an "isolation transistor." For example, transistor 210 may be coupled such that one of the source or the drain of transistor 210 is coupled to memory cell 202 (for example at the junction of memory storage device 206A and switch 208A) and the other of the source or the drain of transistor 210 is coupled to memory cell 204 (for example at the junction of memory storage device 206B and switch 208B). In alternate implementations, transistor 210 may be coupled in other ways to memory cells 202 and/or 204, as discussed below. In one implementation, transistor 210 is a MOS device. For example, in alternate implementations, transistor 210 may be a NMOS device (as shown in FIG. 2) or a PMOS device. Although transistor 210 is described as a MOS transistor, in alternate implementations, transistor 210 may be another type of device (e.g., diode, memristor, etc.) or may be another type of transistor (e.g., BJT, JFET, FREDFET, etc.) and provide the electrical isolation described herein. In one implementation, transistor 210 is the same type of device as at least one of switches 208A and/or 208B.

As shown in FIG. 2, in some implementations, the word line WL is coupled to the gates of switches 208A and 208B. In one implementation, as also shown in FIG. 2, the gate of transistor 210 is also coupled to the word line WL. Accordingly, in that implementation, word line WL may toggle transistor 210 as well as switches 208A and 208B.

In one implementation, transistor 210 provides electrical isolation between memory cells 202 and 204. For example, transistor 210 may be used in place of shallow trench isolation (STI) between memory cells 202 and 204 on a semiconductor chip. This is illustrated in the layout schematic of FIG. 3. The illustration of FIG. 3 shows partial detail of an example layout of the memory device 200. It is understood that some detail of the example layout of memory device 200 is omitted in FIG. 3 for the purposes of clarity in this discussion. The areas on the example layout schematic of FIG. 3 labeled as 208A and 208B designate the locations of the respective switches (e.g., transistors 208A and 208B) on a semiconductor (e.g., silicon, germanium, gallium arsenide, etc.) chip 302. In one implementation, as shown in FIG. 3, a like device to switches 208A and/or 208B is located at the location labeled as 210 (e.g., transistor 210) on the semiconductor chip 302. For example, in one implementation, switches 208A and/or 208B may be MOS transistor devices. Another MOS transistor device, transistor 210, is located between switches 208A and 208B (in the location labeled as 210 in FIG. 3) on the semiconductor chip 302. Here, the transistor 210 is located between the switches 208A and 208B to electrically isolate switches 208A and 208B instead of, for example, an area of substrate semiconductor material (no particular device), (i.e., STI).

The use of a transistor 210 for electrical isolation instead of, for example, STI, may result in area savings on the chip 302. Locating multiple devices (such as memory cells 202 and 204) on a single chip (for example chip 302), may necessitate employing methods or devices on the chip to provide electrical isolation between the devices to prevent them from electrically interfering with each other. Using STI for electrical isolation necessarily requires minimum dimensions of STI based on manufacturability and/or design rules. In contrast, locating a transistor, such as transistor 210, between the devices on the chip may provide sufficient electrical isolation between the devices, with equal or lesser dimensions, and with added benefits (i.e., increased current capability of the memory device). In some implementations, on-chip area savings may also result that may be translated into a denser chip (i.e., more devices per chip area).

In alternate implementations, a memory device 200 may comprise alternate or additional elements to those described herein, the alternate or additional elements configured to perform memory storage functions as disclosed herein.

Example Implementations

FIG. 4 is a schematic drawing of an example implementation of a memory device 400. As shown in FIG. 4, memory device 400 may include a plurality of pairs of memory cells. In alternate implementations, the memory cells may be arranged in rows and/or columns. For example, in one implementation, memory device 400 includes two of memory device 200, or in other words, two pairs of memory cells (202, 204, 402, and 404). Memory cells 202, 204, 402, and 404 each include a memory storage device (206A, 206B, 406A, 406B) and a switch (208A, 208B, 408A, 408B).

In one implementation, as shown in FIG. 4, a word line WL is coupled to each memory cell 202, 204, 402, and 404. For example, word line WL may be coupled to the gate of each switch (208A, 208B, 408A, 408B respectively) of each memory cell 202, 204, 402, and 404. In one implementation, word line WL is configured to toggle each switch 208A, 208B, 408A, 408B, controlling the flow of current through the switches, and thus, the memory storage devices 206A, 206B, 406A, 406B respectively. In alternate implementations, the word line WL may be coupled to the switches 208A, 208B, 408A, and 408B such that they operate in unison when controlled by the word line WL (i.e., all on or all off together) or the switches 208A, 208B, 408A, and 408B may operate otherwise in various combinations (for example, one or more turns off when the others turn on, and vice versa). In other alternate implementations, more than one word line may be used in the memory device 400. For example, two or more word lines may be used, with each word line controlling a defined group of memory cells, as described below.

In one implementation, as shown in FIG. 4, memory cells 202, 204, 402, and 404 are all coupled to a shared (common) source line SL. In alternate implementations, memory cells 202, 204, 402, and 404 may be coupled to separate source lines, or may be coupled to shared source lines in groups. In the example memory device 400, memory cell 202 is accessed via bit line BL0, memory cell 204 is accessed via bit line BL1, memory cell 402 is accessed via bit line BL2, and memory cell 404 is accessed via bit line BL3. Access to memory cells 202, 204, 402, and 404 includes read and/or write access.

In one implementation, as shown in FIG. 4, a transistor 210 is coupled between memory cell 202 and memory cell 204 as described with reference to FIG. 2, and another transistor 410 is coupled between memory cell 402 and memory cell 404 in like manner. Further, transistor 410 may be likened in terms of composition and function to transistor 210 as described above, but with respect to memory cell 402 and memory cell 404. In alternate implementations, transistor 210 and/or transistor 410 may be the same type of device as at least one of switches 208A, 208B, 408A, and/or 408B.

In one implementation, transistor 210 provides electrical isolation between memory cells 202 and 204 and/or transistor 410 provides electrical isolation between memory cells 402 and 404. For example, transistor 410 may also be used in place of shallow trench isolation (STI) between memory cells 402 and 404 on a semiconductor chip as described above with reference to transistor 210. The use of transistor 410 for electrical isolation instead of, for example, STI, may result in additional area savings on the chip, again possibly leading to a denser chip.

As shown in FIG. 4, in one implementation, the gates of transistors 210 and/or 410 are coupled to the word line WL. In the illustration of FIG. 4, the word line WL is shown partially as a dashed line for clarity in the details of the drawing. Accordingly, in that implementation, word line WL toggles transistors 210 and 410 as well as switches 208A, 208B, 408A, and 408B. In one alternate implementation, word line WL toggles at least one of transistors 210 and/or 410 such that it operates in unison with at least one of switches 208A, 208B, 408A, and 408B (i.e., turns on when at least one of switches 208A, 208B, 408A, and 408B turns on, and turns off when the same one of switches 208A, 208B, 408A, and 408B turns off).

In alternate implementations, a memory device 400 may comprise alternate or additional elements to those described herein, the alternate or additional elements configured to perform memory storage functions as disclosed herein.

In alternate implementations, a memory array may be comprised of many memory cells (or pairs of memory cells) as shown in the example memory array 500 of FIG. 5. In the example array 500 illustrated in FIG. 5, multiple memory cells, or pairs of memory cells, such as memory cells 202 and 204 also shown in FIGS. 2 and 4, are arranged in rows and columns. However, this is not intended to be a limitation. In alternate implementations, multiple memory cells and/or pairs of memory cells may be arranged in other arrangements (e.g., other geometric or offset patterns, etc.).

The memory array 500 is an example of an array of memory devices 200 and/or 400. As shown in FIG. 5, each of the memory cells or pairs of memory cells includes a memory storage device (such as memory storage device 206A) and a switch (such as switch 208A) in similar fashion to the memory device 200 shown in FIG. 2 and the memory device 400 shown in FIG. 4. Accordingly, each of the pairs of memory cells shown in FIG. 5 is intended to function as described with respect to the pairs of memory cells described in FIGS. 2 and 4. In the array of FIG. 5, bit lines are associated with (and coupled to) each of the memory cells in a column of memory cells. The bit lines in the example array (the array having "N" columns of memory cells) are labelled BL0, BL1, BL2, BL3, . . . BL(N−4), BL(N−3), BL(N−2), and BL(N−1). Each bit line provides read and/or write access to each of the memory cells in the respective column.

In one implementation, as shown in FIG. 5, a word line (for example, WL0, WL1, WL2, WL3, WL4, and WL5) is coupled to a switch (for example switch 208A) in each memory cell (for example memory cell 202). In the example implementation shown in FIG. 5, a word line (for example word line WL0) is coupled to each switch in a row of memory cells. For example, there may be one word line coupled to each row of memory cells (or group of memory cells) in the array 500. In alternate implementations, there may be fewer or more word lines than rows in the array 500. (i.e., a word line may be shared by more than one row or group, multiple word lines may be coupled to a single row or group, etc.) In an implementation, a word line is configured to toggle each switch in a row or group of memory cells (i.e., to turn "on" or "off" a flow of current through the switch and the corresponding memory storage device). In alternate implementations, the word line may be coupled to the switches in the row or group such that the switches operate in unison when controlled by the word line (i.e., all on or all off together) or the switches may operate otherwise in various combinations (for example, one or more turns off when the others turn on, and vice versa).

In one implementation, as shown in FIG. 5, multiple columns (and/or rows) of memory cells are coupled to a shared (common) source line (i.e., source line SL0). In alternate implementations, memory cells may be coupled to separate source lines, or may be coupled to shared source lines in groups. For example, in the illustration of FIG. 5, four columns (or two pairs of memory cell columns) are coupled to a single source line (e.g., SL0, SL(N/4−1), etc.). In other implementations, memory cells may be coupled to source lines according to other arrangements or groupings.

In one implementation, as shown in FIG. 5, a transistor (for example, transistor 210) is coupled between each memory cell of a pair of memory cells. This is illustrated in the example array 500 shown in FIG. 5. In the example array 500, transistor 210 is coupled between memory cell 202 and memory cell 204 as also described with reference to FIGS. 2 and 4. In the example implementation shown, other transistors are coupled between memory cells in pairs in like manner. For example, the memory cells of array 500 are arranged in pairs in columns, with a transistor coupled between each of the memory cells in the respective pairs of memory cells. In alternate implementations, isolation transistors used in the array 500 may be the same type of device as at least one of the switches of the memory cells of the array 500.

In one implementation, an isolation transistor (such as transistor 210) provides electrical isolation between each memory cell of a pair of memory cells in the array 500. For example, an isolation transistor may be used in place of shallow trench isolation (STI) between memory cells on a semiconductor chip as described above with reference to FIGS. 2, 3, and 4. The use of isolation transistors for electrical isolation instead of, for example, STI, may provide sufficient electrical isolation between the memory cells with added benefits (i.e., increased current capability of the memory array 500). In some implementations, on-chip area savings may also result that may be translated into a denser array (i.e., more devices per chip area).

As shown in FIG. 5, in one implementation, the gates of a row of isolation transistors (such as transistor 210) are coupled to a word line (for example, WL'0, WL'1, WL'2, WL'3, WL'4, and WL'5.) In other implementations, isolation transistors may be coupled to word lines in different groupings. In the implementation shown in FIG. 5, the word line coupled to the isolation transistors is separate from word lines coupled to the switches in the array 500. In alternate implementations, the isolation transistors and the switches may share (be coupled to) one or more common (shared) word lines. In one implementation, a word line (such as word line WL'0) toggles at least one isolation transistor (such as transistor 210) such that it operates in unison with at least one of the switches (i.e., turns on when at least one of switches turns on, and turns off when the same one of switches turns off).

In alternate implementations, a memory array 500 may comprise alternate or additional elements to those described herein, the alternate or additional elements configured to perform memory storage functions as disclosed herein.

Representative Operation Principles

FIGS. 6 and 7 are schematic diagrams illustrating example operation principles of the memory device 400, and apply to devices 200 and 400 described with reference to FIGS. 2 and 4. In general, a memory storage device (such as device 206A) is accessed (i.e., read and/or write) when a bit line (such as bit line BL0) and a word line (such as word line WL) are selected in combination. Then, reading and/or writing to the memory storage device is accomplished by applying a predetermined voltage and/or current to one or more nodes. In the examples given throughout this disclosure, representative operation principles may be described with respect to a particular node, memory storage device, bit line, and the like. The examples given are for clarity in describing the principles, and apply equally to the other equivalent nodes, memory storage devices, bit lines, etc. in the described circuit.

In alternate implementations, memory storage devices (e.g., 206A, 206B, 406A, 406B) are NVM dipole devices that have resistance states based on a value (e.g., 0, 1) currently stored by the device. For example, the memory storage devices 206 may be magnetic tunnel junction (MTJ) dipole devices, or the like, as discussed above.

Using the example of memory storage device 206A, a switch 208A associated to the memory storage device 206A may be configured to selectively couple memory storage device 206A to the source line SL in response to a control signal received on the word line WL. The arrows in FIGS. 6-9 indicate a flow of current. The write operations illustrated in FIGS. 6 and 7 show examples of the bi-directional write current capability of the memory device 400 (and 200).

During an example write operation on memory storage device 206A, as shown in FIG. 6, the bit line BL0 is biased to a "write voltage level low," for example 0 volts, and a predetermined write current (with a corresponding "write voltage level high" VDD, for example 1.1 volts) is applied to the source line SL. A control voltage VDD+ (for example +1.5 volts) may be applied to the word line WL, to turn on the switch 208A (activate a flow of current through the switch 208A and the memory storage device 206A), based on the voltage difference between BL0 and source line SL. The flow of current through storage device 206A is based at least in part on the resistance of storage device 206A, and results in a stored value (e.g., 0, 1) at storage device 206A.

In an implementation, as shown in FIG. 6, a transistor 210 provides electrical isolation between memory storage devices 206A and 206B when in an "off" or non-conductive state (as determined by the value of a control signal at its gate) during the write operation at bit line BL0. This "off" condition of transistor 210 may be sufficient to prevent the flow of undesired current between bit lines BL1 and BL0, and provide inter-cell electrical isolation between the neighboring memory cells (202 and 204, as shown in FIG. 4).

In an implementation, transistor 210 may provide an additional write current path when "on" (as determined by the value of the control signal at its gate) during the write operation at bit line BL0, thereby increasing the overall write current capability of the memory device 400.

In one implementation, bit line BL1 may be "floating" with respect to the voltage at BL0, to reduce undesired current flow through bit line BL1, preventing unintentional write access to memory storage device 206B. Alternately, in an implementation, bit line BL1 may be coupled to ground to reduce or prevent undesired current flow through bit line BL1. In alternate implementations, bit lines BL2 and/or BL3 may be biased to the same voltage as SL (i.e., VDD) to prevent a flow of current through bit lines BL2 and/or BL3. This may be useful to avoid or prevent unintentional write access to the memory storage devices 406A and 406B during the write operation at BL0.

Another example write operation at bit line BL0 is illustrated in the schematic of FIG. 7. In the example shown in FIG. 7, however, the write current polarity is opposite to that shown in FIG. 6, due to reversed biasing of bit line BL0 with respect to source line SL. For example, the source line SL is biased to a "write voltage level low," for example 0 volts, and a write current (with a corresponding "write voltage level high" VDD, for example 1.1 volts) is applied to bit line BL0. A control voltage VDD (for example +1.1 volts) is applied to word line WL to turn "on" switch 208A, allowing a flow of current from bit line BL0 to the source line SL. In one implementation, the direction of current flow between the bit line BL0 and the source line SL (as determined by applying predetermined voltages at these nodes) determines the value (e.g., 0 or 1) stored at the memory storage device 206A.

In an implementation, transistor 210 may provide an additional write current path when "on" (as determined by the value of the control signal at its gate) during the write operation at bit line BL0, thereby increasing the overall write current capability of the memory device 400. This may have the benefit of providing additional current to the memory storage device 206A to improve the write operation.

In one implementation, bit line BL1 may be "floating" with respect to the voltage at BL0, to reduce or prevent undesired current flow through bit line BL1. In alternate implementations, bit lines BL2 and/or BL3 may be biased to the same voltage as SL (i.e., 0 volts) to prevent a flow of current through bit lines BL2 and/or BL3. This may be useful to avoid or prevent unintentional write access to the memory storage devices 406A and 406B during the write operation at BL0.

Figure 8:
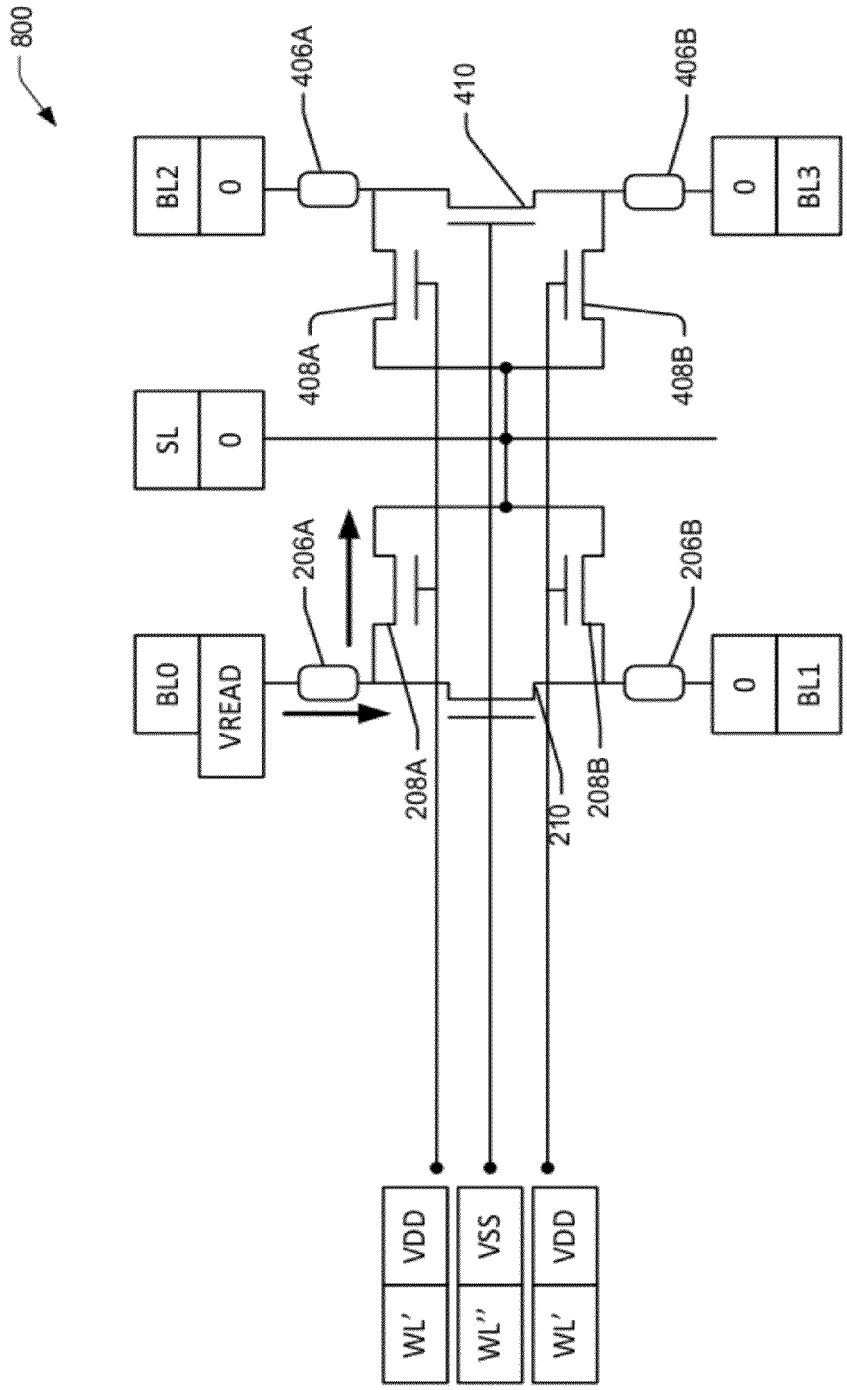
FIG. 8 is a schematic drawing of an implementation of the memory architecture of FIG. 4, including two word lines.

An example read operation at bit line BL0 is illustrated in the schematic of FIG. 8. FIG. 8 is a schematic drawing of an implementation 800 of the memory architecture described with reference to FIGS. 4, 6, and 7. However, in the implementation illustrated in FIG. 8, multiple word lines are used to toggle various switches. In the example shown, two word lines are used (WL' and WL") to toggle two groups of switches. In alternate implementations, additional word lines may also be used to toggle other groupings of switches, as described below.

In one implementation 800, as illustrated in FIG. 8, word line WL' is coupled to, and configured to toggle each of switches 208A, 208B, 408A, 408B, controlling the flow of current through the switches, and thus, the memory storage devices 206A, 206B, 406A, 406B respectively. The word line WL' may control the flow of current through these switches as described above. Additionally, a word line WL" is coupled to, and configured to toggle each of switches (transistors) 210 and 410, controlling the flow of current through these switches, and thus controlling whether each switch 210 and/or 410 is providing electrical isolation between memory cells (by being in a non-conductive "off" state) or providing a conducting path between memory cells (by being in a conductive "on" state) as described above with respect to FIGS. 4, 6, and 7.

In one implementation 800, the word lines WL' and WL" are driven independently. Driving the two word lines independently may reduce or prevent read disturb between neighboring memory cells. For example, by using a separate word line WL", transistors 210 and 410 may be switched independently from switches 208A, 208B, 408A, and 408B. Thus, one or more of switches 208A, 208B, 408A, and 408B may be switched "on" while transistors 210 and 410 may be switched "off." This combination of independent switching may reduce or prevent a flow of current from bit lines BL1 during a read operation at BL0, and thereby suppress read disturb from that bit line. Additionally, the use of two word lines as shown may provide greater control over individual switches in various implementations. In an alternate implementation, two word lines are coupled to different groupings of switches, providing alternate control over the switches in the different groupings.

In one implementation, the word lines WL' and WL", as shown in FIG. 8, are coupled together and driven together. For example, the word lines WL' and WL" may be coupled such that they have continuity, and toggle respective switches and/or transistors concurrently. In one example, word lines WL' and WL" may be coupled together such that switches 208A and 208B turn "on" together with transistor 210. This may result in a reduced variability of the composite access device, the composite access device comprising switches 208A and 208B and transistor 210 when the word lines are coupled together. For example, the effects of variations in switch 208A due to manufacturing may be reduced or eliminated by combining the switch 208A with switch 208B and transistor 210 (activating them concurrently) during a read operation.

On the other hand, during a write operation at bit line BL0, coupling and driving word lines WL' and WL" together may result in an effectively "larger device" response than with the individual devices, where the current through memory storage device 206A is increased during the write operation. In one implementation, the write current through memory storage device 206A is increased by approximately 50% when the word lines WL' and WL" are coupled and driven together. In alternate implementations, the write current through memory storage device 206A is increased a lesser or greater amount due to coupling the word lines.

Figure 9:
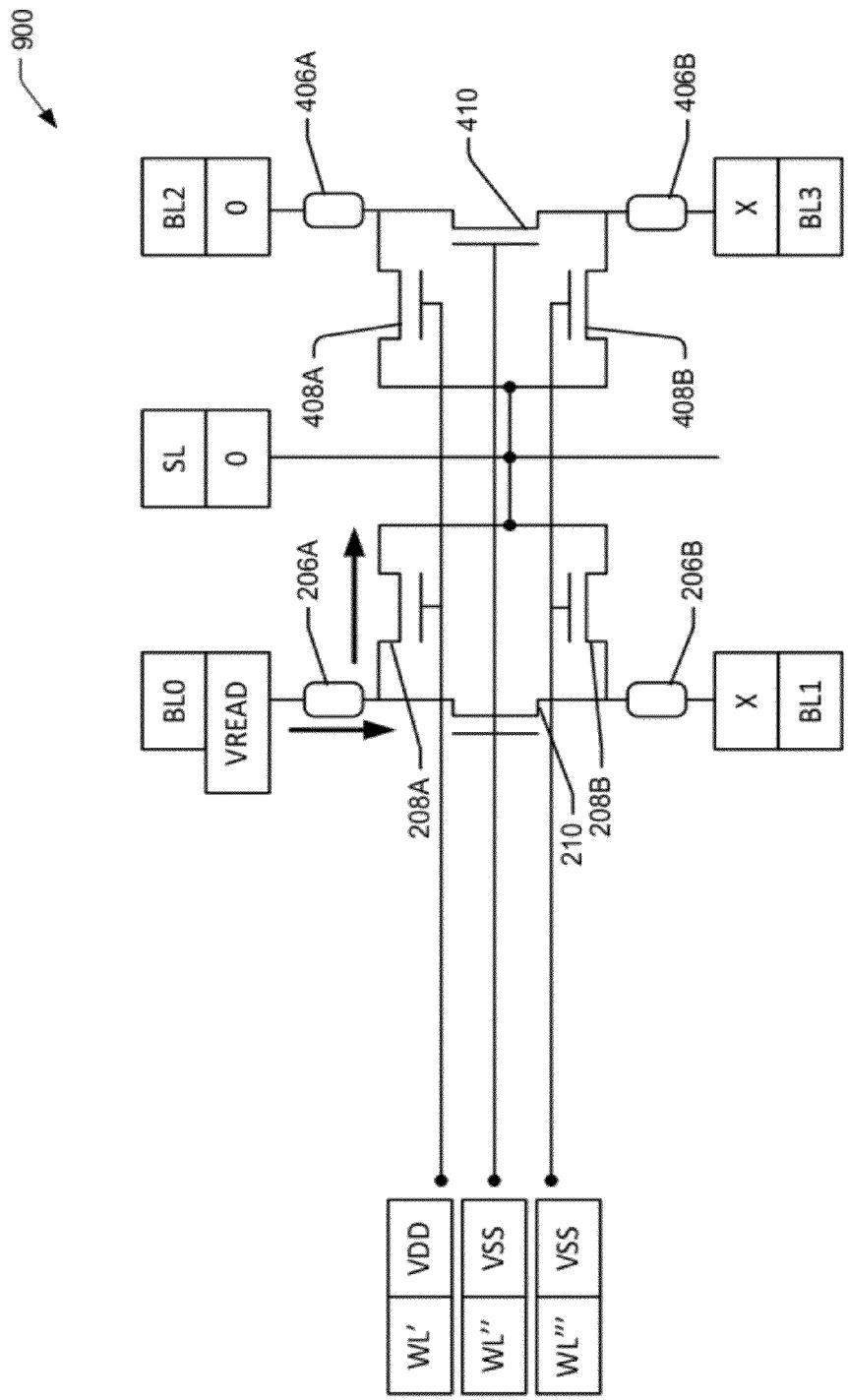
FIG. 9 is a schematic drawing of an implementation of the memory architecture of FIG. 4, including three word lines.

In an alternate implementation 900, as illustrated in FIG. 9, word line WL' is coupled to, and configured to toggle each of switches 208A and 408A, controlling the flow of current through the switches, and thus, the memory storage devices 206A and 406A respectively. Additionally, a word line WL'" is coupled to, and configured to toggle each of switches 208B and 408B, controlling the flow of current through the switches, and thus, the memory storage devices 206B and 406B respectively. The word lines WL' and WL'" may control the flow of current through these switches as described above. Further, as described with respect to FIG. 8, a word line WL" is coupled to, and configured to toggle each of switches (transistors) 210 and 410, controlling the flow of current through these switches, and thus controlling whether each switch 210 and/or 410 is providing electrical isolation between memory cells (by being in a non-conductive "off" state) or providing a conducting path between memory cells (by being in a conductive "on" state) as described above with respect to FIGS. 4, 6, 7, and 8.

In one implementation 900, the word lines WL', WL", and WL'" are driven independently. Driving the three word lines independently may further reduce or prevent read disturb between neighboring memory cells, as shown in FIG. 9. Additionally, the use of three word lines, as shown, may provide even greater control over individual switches in various implementations. For example, during the read operation shown in FIG. 9, switches 208A and 408A are selected as "conducting" based on a signal received from word line WL'. Switches 208B and 408B, as well as isolation transistors 210 and 410, are controlled independently (by word lines WL'" and WL" respectively), and are shown in a non-conducting state. Since the read operation is occurring at bit line BL0, a voltage "vread" is applied to BL0 and zero volts are applied to the source line SL and also to BL2, resulting in a current flow for read access through the memory storage unit 206A.

The lack of current flow through the other portions of the memory device 900 (i.e., the other bit lines, switches, etc.) reduces or prevents read disturb of the read operation at BL0, for example. This is further illustrated in FIG. 9 by the use of an "X" at bit lines BL1 and BL3. In an implementation, the voltage at bit lines BL1 and BL3 may be irrelevant during a read operation at bit line BL0, if switches 208B and 408B as well as transistors 210 and 410 are switched "off" (non-conducting state) while switches 208A and 408A are independently switched "on" (conducting). Again, this switched state may be accomplished with independently driven word lines.

In an alternate implementation, three word lines are coupled to different groupings of switches, providing alternate control over the switches in the different groupings. In alternate implementations, other numbers of word lines may be used to control various other groupings of switches.

In one implementation, the word lines WL', WL", and WL'", as shown in FIG. 9, are coupled together and driven together. For example, the word lines WL', WL", and WL'" may be coupled such that they have continuity, and toggle respective switches and/or transistors concurrently, as described above with reference to FIG. 8. In one example, word lines WL', WL", and WL''' may be coupled together such that switches 208A and 208B turn "on" together with transistor 210. Again, this may result in a reduced variability of the composite access device comprising switches 208A and 208B and transistor 210 when the word lines are coupled together. For example, the effects of variations in switch 208A due to manufacturing may be reduced or eliminated by combining the switch 208A with switch 208B and transistor 210 (activating them concurrently) during a read operation.

Similar to that described above, during a write operation at bit line BL0, coupling and driving word lines WL', WL", and WL''' together may result in an effectively "larger device" response than with the individual devices, where the current through memory storage device 206A is increased during the write operation. In one implementation, the write current through memory storage device 206A is increased by approximately 50% when the word lines WL', WL", and WL''' are coupled and driven together. In alternate implementations, the write current through memory storage device 206A is increased a lesser or greater amount due to coupling the word lines.

Example Implementations with Additional Isolation Transistors

Figure 10:
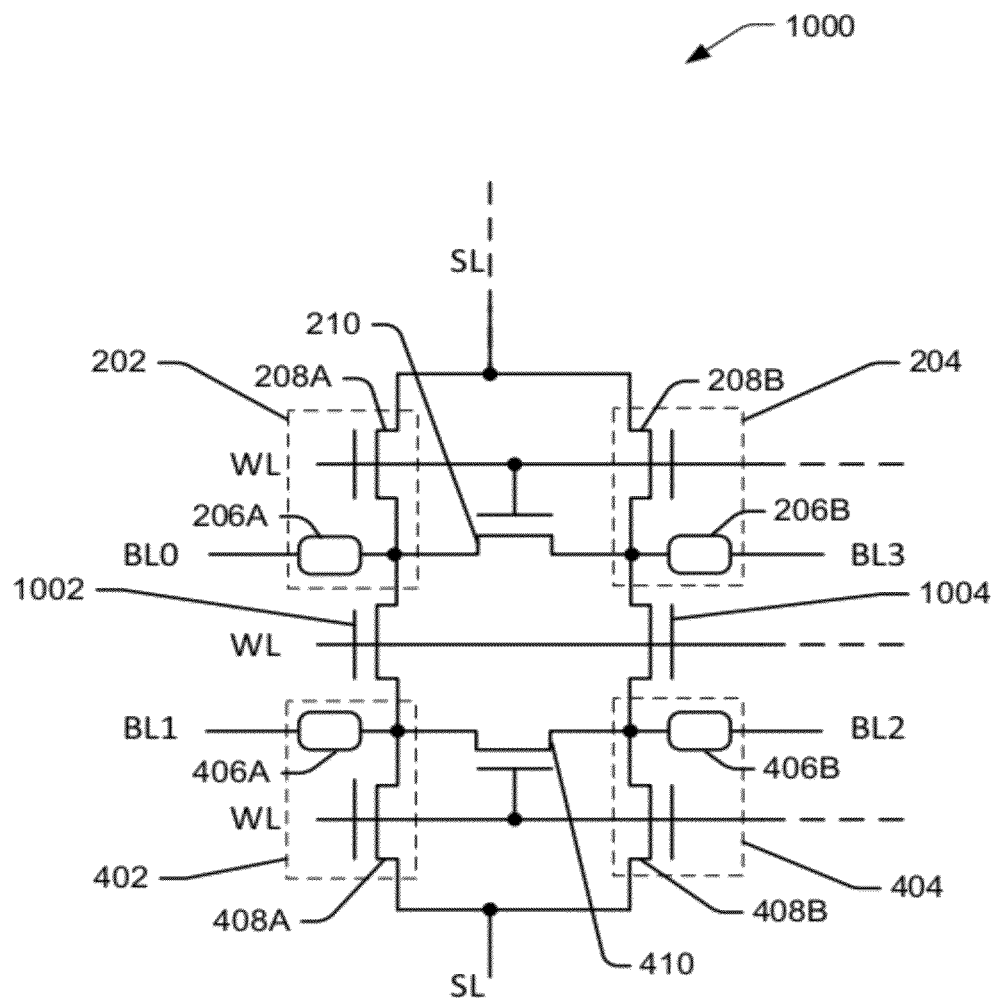
FIG. 10 is a schematic drawing of a third implementation of memory architecture, including isolation transistors between pairs/groups of memory cells.

FIG. 10 is a schematic drawing of an implementation of a memory device 1000, which includes additional transistors (1002 and 1004) between pairs of memory cells. The memory device 1000 functions in a similar manner to memory devices 200 and 400 as has been described above with respect to FIGS. 4, and 6-9, and may be comprised of similar components. However, the memory cell 1000 includes one or more additional transistors (isolation transistors) configured to provide isolation between groups of memory cells, as discussed further. For example, transistors 1002 and 1004 may be used in place of shallow trench isolation (STI) between groups of memory cells or pairs of memory cells to provide electrical isolation between the groups or pairs of memory cells on a semiconductor chip. In alternate implementations, the electrical isolation provided by isolation transistors (such as transistors 210, 410, 1002 and 1004, for example) may be between rows and/or columns of memory cells (or groups of memory cells).

In the illustration of FIG. 10, a first pair of memory cells includes memory cells 202 and 204. Each of the memory cells 202, 204 includes a switch (208A and 208B, respectively). Word line WL is coupled to each switch 208A and 208B, and is configured to toggle switches 208A and 208B to control the flow of current to memory storage devices 206A and 206B respectively, as described above. Each switch may selectively couple an associated memory storage device to the source line SL in response to a control signal received on the word line WL, to access read/write to the memory storage device. A transistor 210 is coupled to each of the memory cells 202 and 204, to provide electrical isolation when the transistor 210 is "off" (or alternately, to provide a conductive path through the transistor 210 when selected "on") between the memory cells 202 and 204. In one implementation, as shown in FIG. 10, the gate of the transistor 210 is coupled to the word line WL.

Additionally, a second pair of memory cells includes memory cells 402 and 404. Each of memory cells 402 and 404 include a switch (408A and 408B, respectively). In one implementation, the word line WL is coupled to the switches 408A and 408B, and is configured to toggle switches 408A and 408B as also described above. In alternate implementations, one or more other word lines (such as word lines WL', WL", WL''', or the like) may be coupled to one or both of switches 408A and 408B, the other word lines being configured to toggle one or both of the switches. A transistor 410 is coupled to each of the memory cells 402 and 404, to provide electrical isolation when the transistor 410 is "off" (or alternately, to provide a conductive path when selected "on") between the memory cells 402 and 404. In one implementation, as shown in FIG. 10, the gate of the transistor 410 is coupled to the word line WL. In alternate implementations, the gate of transistor 410 may be coupled to the one or more other word lines mentioned above with respect to switches 408A and 408B.

In one implementation, as shown in FIG. 10, the first pair of memory cells (202 and 204) and the second pair of memory cells (402 and 404) share a common source line SL. In alternate implementations, one or more of the memory cells or the pairs of memory cells may use alternate or additional source lines.

As discussed above with respect to FIGS. 2, 4, and 6-9, in an implementation, one or more of the memory cells of the pairs of memory cells comprising memory device 1000 may include a NVM memory storage device. Alternately or additionally, one or more of the memory cells may include an alternate technology memory storage device (e.g., MRAM, PRAM, OUM, CRAM, FERAM, FE Polymer devices, NROM, contact ROM, via ROM, etc.). Additionally, as discussed, one or more of the switches of the pairs of memory cells may be a MOS device. For example, one or more of the switches may be a NMOS or a PMOS transistor device. Alternately or additionally, one or more of the switches may be an alternate technology (e.g., JFET, FREDFET, etc.) switching device.

In one implementation, as shown in FIG. 10, the memory device 1000 may include one or more additional transistors (shown as 1002 and 1004) configured to electrically isolate one pair of memory cells from another pair of memory cells. For example, in the illustration of FIG. 10, a transistor 1002 is coupled between memory cells 202 and 402, providing electrical isolation between memory cells 202 and 402. In one implementation, transistor 1002 also provides electrical isolation between the first pair of memory cells (202 and 204) and the second pair of memory cells (402 and 404). Additionally (or alternately), transistor 1004 is coupled between memory cells 204 and 404, providing electrical isolation between memory cells 204 and 404. In an implementation, transistor 1004 also provides electrical isolation between the first pair of memory cells (202 and 204) and the second pair of memory cells (402 and 404). In alternate implementations, transistors 1002 and 1004 (or the like) may be coupled in alternate configurations to provide electrical isolation between memory cells or pairs (or groups) of memory cells.

In the example implementation shown in FIG. 10, the gates of transistors 1002 and 1004 are coupled to the word line WL. Accordingly, the word line WL toggles transistors 1002 and 1004, to provide electrical isolation when selected to be "off" and/or a conducting path when selected to be "on." In alternate implementations, the gates of one or both of transistors 1002 and 1004 may be coupled to one or more alternate or additional word lines, those word lines toggling one or both of transistors 1002 and 1004. For example, in one implementation, a word line (WL or other) coupled to the gates of transistors 1002 and 1004 may be configured to toggle transistors 1002 and 1004 such that they electrically isolate the first pair of memory cells (202 and 204) from the second pair of memory cells (402 and 404) when the word line is unselected (putting the transistors 1002 and 1004 in a non-conducting "off" state), and such that transistors 1002 and 1004 allow current to flow between the first pair of memory cells and the second pair of memory cells when the word line is selected (putting the transistors 1002 and 1004 in a conducting "on" state).

Additionally, transistors 1002 and 1004 provide electrical isolation between neighboring bit lines (BL0 and BL1 for transistor 1002, and BL2 and BL3 for transistor 1004) when the word line (here WL) is unselected, and transistors 1002 and 1004 provide current paths between neighboring bit lines when the word line is selected. Examples of the memory device 1000 where the transistors 1002 and 1004 are in "on" states (word line selected) are shown with reference to FIGS. 11 and 12, where a write operation at bit line BL0 is occurring in both of FIGS. 11 and 12.

Figure 11:
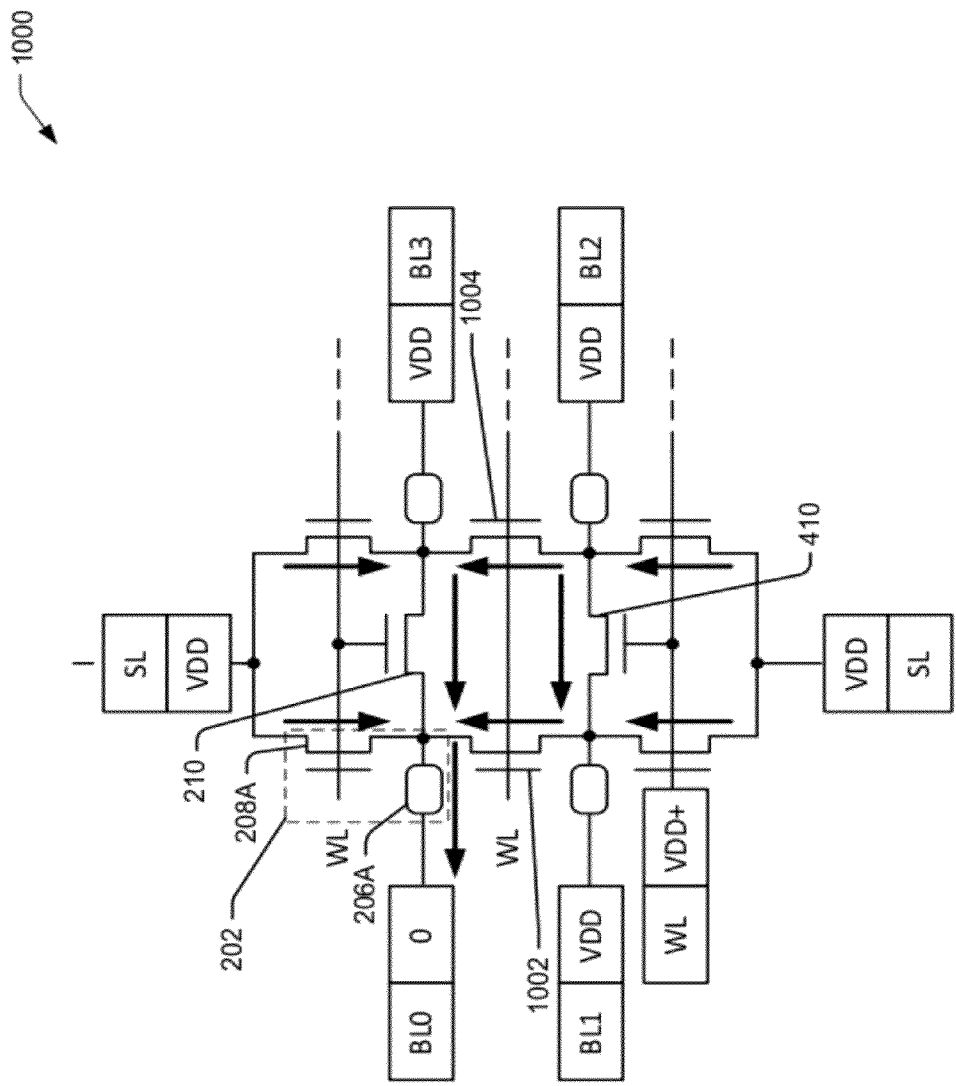
FIG. 11 is a current flow diagram illustrating example operation principles of the implementation of FIG. 10.
Figure 12:
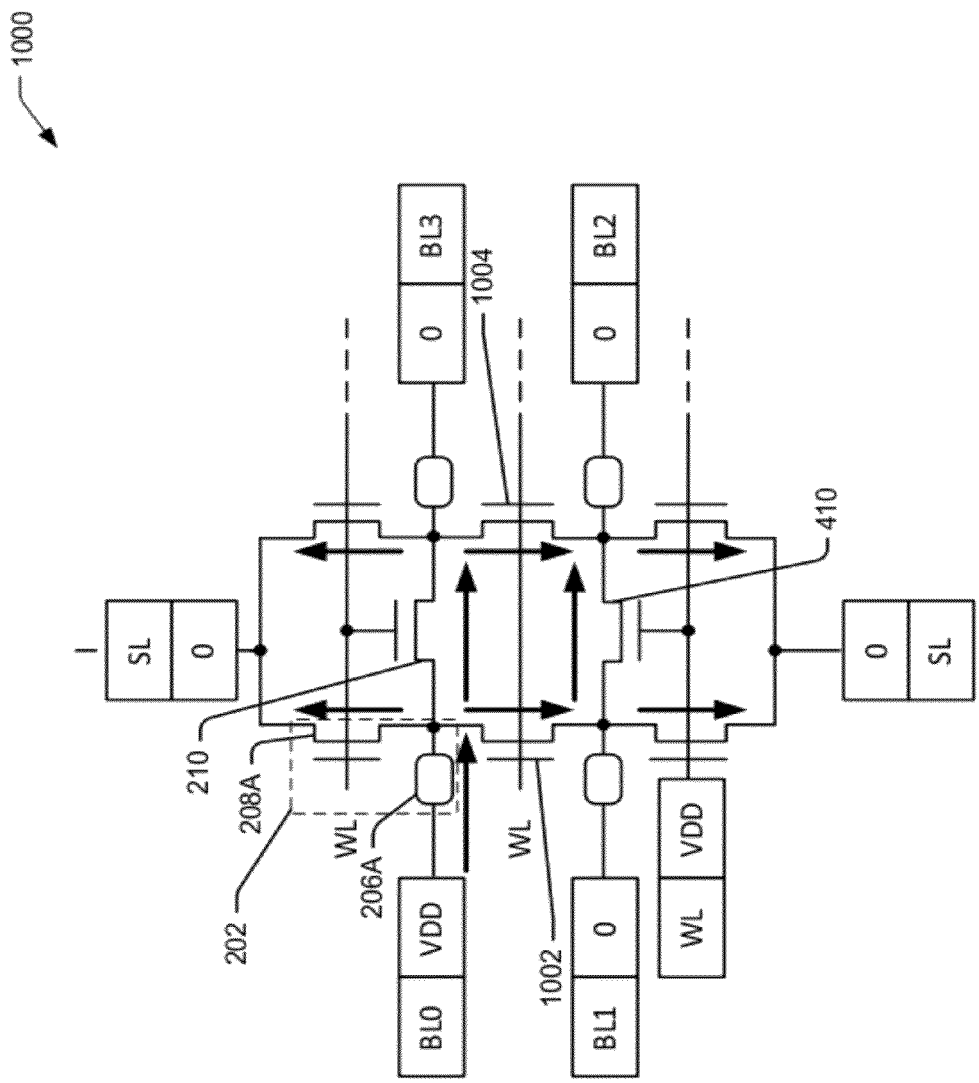
FIG. 12 is a current flow diagram illustrating other example operation principles of the implementation of FIG. 10.
Figure 13:
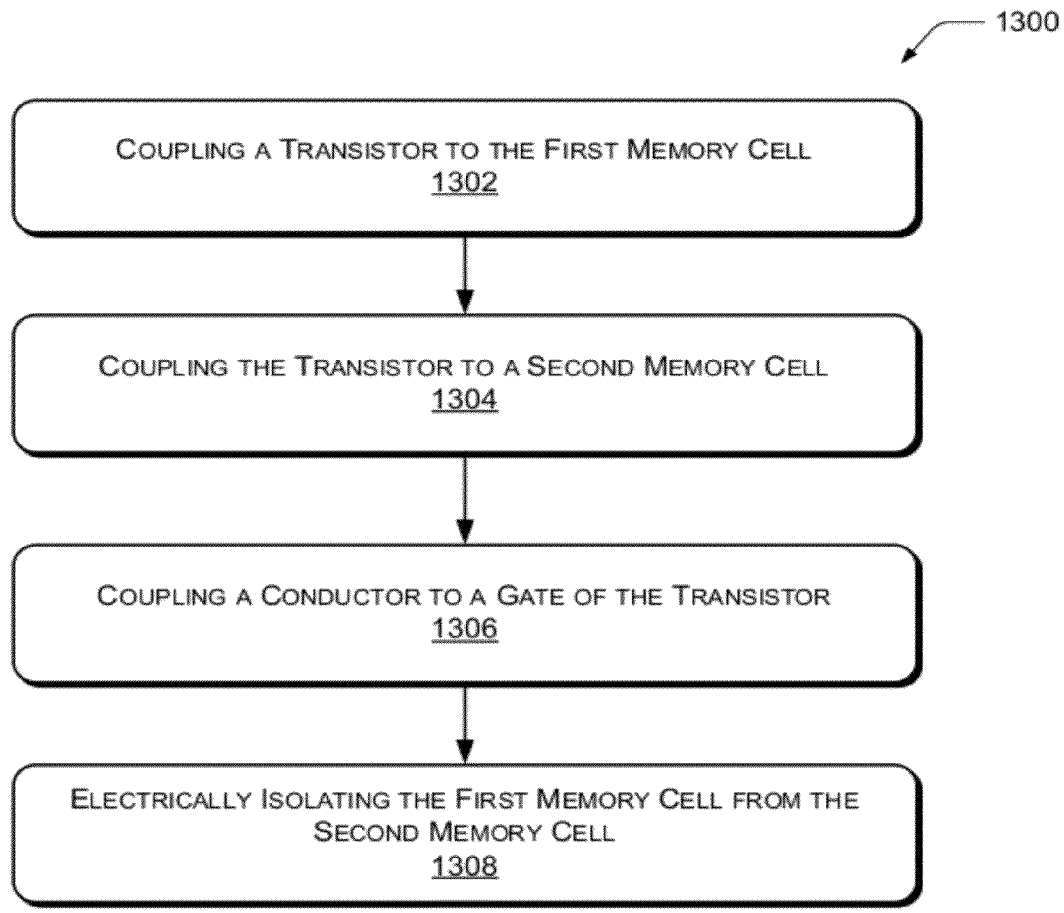
FIG. 13 is a flow diagram illustrating an example method of electrically isolating a first memory cell and a second memory cell from each other.

The schematic drawings of FIGS. 11 and 12 show an example implementation of the memory device 1000 including bi-directional write current capability. The schematic of FIGS. 11 and 12 illustrate the memory device 1000 in a write operation at bit line BL0. While some of the labels have been omitted at FIGS. 11 and 12 for greater clarity, it is understood that the memory device 1000 of FIG. 10 is represented in FIGS. 11 and 12, including all of the components shown and described with reference to FIG. 10.

In an implementation, as illustrated in FIGS. 11 and 12, the memory device 1000 is capable of bi-directional write currents due to voltage biasing on particular bit lines and on the source line SL, as described above with respect to FIGS. 6 and 7. Bi-directional write current capability may provide greater flexibility in the types of memory storage devices 206 that may be used in the formation of a memory device 200, 400, and/or 1000. For example, bi-directional write currents are used when writing to a STT-MRAM device (or the like) when it is used as a memory storage device 206. A first current polarity may be used to write a 0 to the STT-MRAM device, and an opposite polarity may be used to write a 1 to the STT-MRAM device.

In one implementation, transistors 210, 410, 1002, and 1004 provide electrical isolation between memory cells and/or pairs/groups of memory cells when they are in a non-conductive state, and provide a current path between memory cells and/or pairs/groups of memory cells when they are in a conductive state.

The combination of transistors 210 and 410 with transistors 1002 and 1004 allows for additional current paths for writing to a bit line of the memory device 1000. As shown in the illustration of FIG. 11, where a 0 ("zero") is written to bit line BL0 (to be stored in memory storage device 206A), current paths between the source line SL and the bit line BL0 include not only a path through switch 208A, but also multiple additional paths through (at least) transistors 210, 410, 1002 and 1004. The arrows in the diagram show the direction of current flow, from the source line SL to the bit line BL0. Again, as shown in FIG. 12, where a 1 ("one") is written to bit line BL0 (to be stored in memory storage device 206A), current paths between the source line SL and the bit line BL0 include not only a path through switch 208A, but also multiple additional paths through (at least) transistors 210, 410, 1002 and 1004. The arrows in the diagram show the direction of current flow, from the bit line BL0 to the source line SL. In one implementation, memory cells and/or pairs/groups of memory cells share a common source line (such as source line SL, shown in FIGS. 10-12).

In an alternate implementation of the memory device 1000, when a read operation is in progress at a bit line, one or more of the other bit lines may be floating with respect to a voltage at the bit line, to reduce or prevent read disturb. For example, in the illustration of FIG. 12, one or more of bit lines BL1, BL2, and BL3 may be floating with respect to the voltage at BL0 during a read operation at BL0. Alternately, in one implementation, one or more of bit lines BL1, BL2, and BL3 may be coupled to ground to reduce or prevent undesired current flow through bit lines BL1, BL2, and BL3.

Representative Processes

FIG. 13 illustrates a representative process 1300 for electrically isolating a first memory cell from a second memory cell on a semiconductor chip. The process 1300 is described with reference to FIGS. 2-12. The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable hardware, software, firmware, or a combination thereof, without departing from the scope of the subject matter described herein.

At block 1302, a transistor (such as transistor 210) is coupled to a first memory cell (such as memory cell 202). In an implementation, the source or the drain of the transistor is coupled to the first memory cell (as shown in FIG. 2, for example).

At block 1304, the transistor is also coupled to a second memory cell (such as memory cell 204). In an implementation, the other of the source or the drain of the transistor is coupled to the second memory cell (as shown in FIG. 2, for example). In alternate implementations, another switching device (e.g., diode, memristor, etc.) may be coupled to the first and second memory cells in place of the transistor, and in like manner, according to the respective terminals on the other switching device.

At block 1306, a conductor (such as word line WL, for example) is coupled to a gate of the transistor such that the conductor is configured to toggle the transistor between a conducting state and a non-conducting state. Additionally or alternately, the conductor is also coupled to a gate of a first switch (such as switch 208A, for example) of the first memory cell and/or to a gate of a second switch (such as switch 208B, for example) of the second memory cell such that the conductor is configured to toggle the first switch and/or the second switch between a conducting state and a non-conducting state.

At block 1308, the transistor (or other switching device) electrically isolates the first memory cell from the second memory cell when the transistor is in a non-conductive state (as determined by a signal from the conductor). In alternate implementations, the transistor may provide a conductive path when the transistor is in a conductive state (as determined by another signal from the conductor).

In some implementations, multiple pairs or groups may be included in a memory device. For example, the first memory cell may be one of a first group of memory cells and the second memory cell may be one of a second group of memory cells. In an implementation, a second transistor (or other switching device) is coupled at one of a source or a drain (or respective terminals) of the second transistor to a third memory cell, the third memory cell being another of the first group of memory cells. Additionally, the second transistor is coupled at the other of the source or the drain of the second transistor to a fourth memory cell, the fourth memory cell being another of the second group of memory cells. In an implementation, the second transistor electrically isolates the first group of memory cells from the second group of memory cells when configured in this manner, when the second transistor is in a non-conductive state.

In alternate implementations, the second transistor may be toggled between non-conductive and conductive states based on a control signal received at its gate. Accordingly, the second transistor may provide a current path between memory cells or pairs/groups of memory cells when in a conductive state. In various implementations, additional transistors (or other switching devices) may be used to isolate memory cells and/or groups of memory cells when in a non-conductive state and provide current paths between memory cells and/or groups of memory cells when in a conductive state.

In alternate implementations, the first and/or second transistors may be coupled in various other ways to provide electrical isolation or conductive paths in a memory device. Further, memory cells may be arranged in patterns, arrays, or the like, and may share source lines in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing the invention.

What is claimed is:

1. An electronic device comprising:
a first memory cell including a first switch;
a second memory cell including a second switch;
a conductor coupled to the first switch and to the second switch and configured to toggle the first switch and the second switch; and
a transistor coupled at one of a source or a drain of the transistor to the first memory cell and coupled at the other of the source or the drain of the transistor to the second memory cell, a gate of the transistor coupled to the conductor.

2. The electronic device of claim 1, wherein at least one of the first switch, the second switch, and the transistor is a metal-oxide-semiconductor (MOS) device.

3. The electronic device of claim 1, wherein at least one of the first memory cell and the second memory cell includes a nonvolatile memory (NVM) dipole device.

4. The electronic device of claim 1, wherein the transistor is configured to electrically isolate the first memory cell from the second memory cell.

5. The electronic device of claim 1, wherein the first memory cell and the second memory cell share a common source line.

6. The electronic device of claim 1, further comprising a first bit line operable to select the first memory cell and/or a second bit line operable to select the second memory cell.

7. A memory device comprising:
a plurality of pairs of memory cells, each memory cell including a switch;
a conductor coupled to each memory cell of at least a first group of the plurality of pairs of memory cells and configured to toggle each switch of each memory cell of the at least first group; and
a transistor coupled to each of the pairs of memory cells, the transistor coupled to each of the memory cells of each pair.

8. The memory device of claim 7, wherein a gate of the transistor is coupled to the conductor.

9. The memory device of claim 7, wherein the plurality of pairs of memory cells share a common source line.

10. The memory device of claim 7, further comprising: a second group of the plurality of pairs of memory cells; and a second transistor configured to couple a first memory cell in the first group to a second memory cell in the second group, the second transistor configured to electrically isolate the first memory cell from the second memory cell.

11. The memory device of claim 10, wherein a gate of the second transistor is coupled to the conductor.

12. The memory device of claim 10, further comprising a third transistor configured to couple a third memory cell in the first group to a fourth memory cell in the second group, the third transistor configured to electrically isolate the third memory cell from the fourth memory cell.

13. The memory device of claim 12, wherein a gate of the third transistor is coupled to the conductor.

14. The memory device of claim 10, further comprising at least one of a first bit line operable to select the first memory cell and a second bit line operable to select the second memory cell.

15. The memory device of claim 14, wherein the second bit line is configurable to float with respect to a voltage present at the first bit line.

16. The memory device of claim 14, wherein at least one of the first bit line and the second bit line are configurable to be biased with respect to a source line to provide bi-directional write capability to at least one of the first memory cell and the second memory cell.

17. An apparatus, comprising:
a first pair of memory cells, each of the first pair of memory cells including a switch;
a first conductor coupled to each switch of the first pair of memory cells, the first conductor configured to toggle each switch of the first pair of memory cells;
a first transistor coupled to the first pair of memory cells, the first transistor coupled to each of the memory cells in the first pair, a gate of the first transistor coupled to the first conductor;
a second pair of memory cells, each of the second pair of memory cells including a switch;
a second conductor coupled to each switch of the second pair of memory cells, the second conductor configured to toggle each switch of the second pair of memory cells; and
a second transistor coupled to the second pair of memory cells, the second transistor coupled to each of the memory cells in the second pair, a gate of the second transistor coupled to the second conductor.

18. The apparatus of claim 17, wherein the first pair of memory cells and the second pair of memory cells share a common source line.

19. The apparatus of claim 17, further comprising a third transistor coupled to a first memory cell of the first pair of memory cells and a first memory cell of the second pair of memory cells; and
a fourth transistor coupled to a second memory cell of the first pair of memory cells and a second memory cell of the second pair of memory cells.

20. The apparatus of claim 19, further comprising a third conductor coupled to a gate of the third transistor and to a gate of the fourth transistor, the third conductor configured to toggle the third transistor and the fourth transistor, wherein the third transistor and the fourth transistor are configured to electrically isolate the first pair of memory cells and the second pair of memory cells from each other when the third conductor is unselected, and wherein the third transistor and the fourth transistor are configured to allow current flow between the first pair of memory cells and the second pair of memory cells when the third conductor is selected.

21. A method for electrically isolating a first memory cell from a second memory cell, the method comprising:
coupling a transistor at one of a source or a drain of the transistor to the first memory cell;
coupling the transistor at the other of the source or the drain of the transistor to the second memory cell;
coupling a conductor to a gate of the transistor, wherein the transistor is toggled between a conducting state and a non-conducting state based on a signal received at the gate of the transistor via the conductor; and
electrically isolating the first memory cell from the second memory cell by the transistor when the transistor is in a non-conducting state.

22. The method of claim 21, further comprising coupling the conductor to a gate of a first switch of the first memory cell and to a gate of a second switch of the second memory cell, wherein the first switch and the second switch are toggled between a conducting state and a non-conducting state based on a signal received at the gate of the first switch and the second switch via the conductor.

23. The method of claim 21, wherein the first memory cell is one of a first group of memory cells and the second memory cell is one of a second group of memory cells;
the method further comprising:
coupling a second transistor at one of a source or a drain of the second transistor to a third memory cell, the third memory cell being another of the first group of memory cells; and
coupling the second transistor at the other of the source or the drain of the second transistor to a fourth memory cell, the fourth memory cell being another of the second group of memory cells,
coupling the conductor to a gate of the second transistor, wherein the second transistor is toggled between a conducting state and a non-conducting state based on a signal received at the gate of the second transistor via the conductor, and
electrically isolating the first group of memory cells from the second group of memory cells by the second transistor when the second transistor is in a non-conducting state.

* * * * *